(12) United States Patent
Hu et al.

(10) Patent No.: US 7,415,058 B2
(45) Date of Patent: Aug. 19, 2008

(54) ULTRA-HIGH-Q SURFACE-TENSION-INDUCED MONOLITHICALLY INTEGRATED ON-CHIP RESONATOR AND ASSOCIATED DEVICES

(75) Inventors: Juejun Hu, Cambridge, MA (US); Anuradha M. Agarwal, Weston, MA (US); Lionel C. Kimerling, Concord, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 11/543,334

(22) Filed: Oct. 5, 2006

(65) Prior Publication Data
US 2007/0091974 A1    Apr. 26, 2007

Related U.S. Application Data

(60) Provisional application No. 60/723,894, filed on Oct. 5, 2005.

(51) Int. Cl.
*H01S 3/08* (2006.01)
(52) U.S. Cl. .................................. 372/101; 372/92
(58) Field of Classification Search ............. 372/50.23, 372/101, 50.1, 92
See application file for complete search history.

(56) References Cited

U.S. PATENT DOCUMENTS 5,426,657 A * 6/1995 Vakhshoori ............. 372/45.01
5,835,517 A * 11/1998 Jayaraman et al. ..... 372/50.124
6,845,120 B2 * 1/2005 Border et al. ............... 372/107

\* cited by examiner

*Primary Examiner*—Armando Rodriguez
(74) *Attorney, Agent, or Firm*—Gauthier & Connors LLP

(57) ABSTRACT

A resonator structure includes a substrate and a cladding layer formed on the substrate. A plurality of lens-shaped optical structures is formed on the cladding layer. The lens-shaped optical structures comprise chacolgenide glass being exposed to a reflow process so as to make smooth the surface of the resonator structure and increase substantially its Q factor.

24 Claims, 2 Drawing Sheets

ULTRA-HIGH-Q SURFACE-TENSION-INDUCED MONOLITHICALLY INTEGRATED ON-CHIP RESONATOR AND ASSOCIATED DEVICES

PRIORITY INFORMATION

This application claims priority from provisional application Ser. No. 60/723,894 filed Oct. 5, 2005, which is incorporated herein by reference in its entirety.

BACKGROUND OF THE INVENTION

The invention is related to microphotonics, and in particular to an ultra-high-Q surface-tension-induced monolithically integrated on-chip resonator.

Optical resonators confine light for extended period and strongly enhance the interaction between light and matter. Due to their light confining nature, optical resonators have now become a focus of both scientific investigation and numerous practical applications, including lasers, optical switches, optical filters, biosensors and nonlinear optics. Quality factor Q, defined as 2 pi times the ratio of optical power dissipated in each round trip light travels in the resonator against power stored in the resonator, characterizes the ability of the resonator to confine light. Strong light-matter interaction is induced in high-Q resonators due to the enhanced optical power confinement, leading to improved device performance characteristics. For instance, in microcavity lasers, increased Q-factor suggests decrease of lasing threshold; in optical switches, high-Q helps to enhance extinction ratio and in sensor applications, improved Q enables higher sensor sensitivity.

Now highest Q-factor value is achieved in surface-tension-induced microcavities (STIMs), namely resonator structures with ultra-smooth surface formed by virtue of surface tension to reduce light scattering loss. The record $10^{10}$ Q-factor has been realized in silica microspheres made by melting the tip of a tapered silica optical fiber. However, at present, the existing STIMs are mostly off-chip, which seriously limited their device robustness in practical applications. The difficulties faced by off-chip resonators are two-fold, which lie in both STIM resonator fabrication and optical coupling scheme. On the fabrication side, the fabrication process of silica microspheres is very difficult to control and reproduce, resulting in varied resonant wavelengths for different microspheres.

The use of high temperature reflow process also makes it intrinsically inappropriate for Si-VLSI process. To resolve the issue, some on-chip resonator designs have been fabricated or proposed, nevertheless a robust coupling configuration is still to be developed. At present even the on-chip STIM resonators still require off-chip fiber evanescent coupling, which is extremely sensitive to the distance between the resonator and fiber bus and thus requires accurate alignment and often vulnerable to environmental changes.

SUMMARY OF THE INVENTION

According to one aspect of the invention, there is provided a resonator structure. The resonator structure includes a substrate, and a cladding layer is formed on the substrate. A plurality of lens-shaped optical structures is formed on the cladding layer. The lens-shaped optical structures comprise chacolgenide glass being exposed to a reflow process so as to make smooth the surface of the resonator structure and increase substantially its Q factor.

According to another aspect of the invention, there is provided a method of forming a resonator structure. The resonator structure includes a substrate, and a cladding layer is formed on the substrate. A plurality of lens-shaped optical structures is formed on the cladding layer. The lens-shaped optical structures comprise chacolgenide glass being exposed to a reflow process so as to make smooth the surface of the resonator structure and increase substantially its Q factor.

DETAILED DESCRIPTION OF THE INVENTION

The invention proposes the utilization of high-index, low-glass-transition-temperature glass and polymer materials to fabricate on-chip resonators, and a vertical waveguide evanescent coupling scheme to achieve robust, highly reproducible resonator coupling suitable for industrial scale applications. A number of novel devices based on the on-chip ultra-high-Q resonator concept can be formed.

Figure 1A:
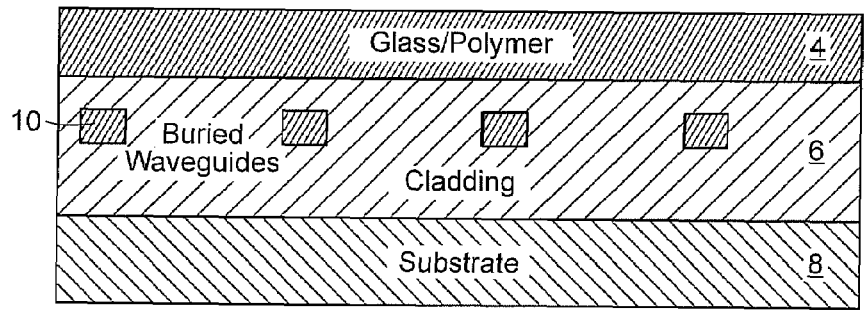
FIGS. 1A-1C are flow graphs demonstrating the fabrication step of the inventive resonator structure using a reflow technique.
Figure 1B:
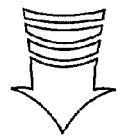
Figure 1B:
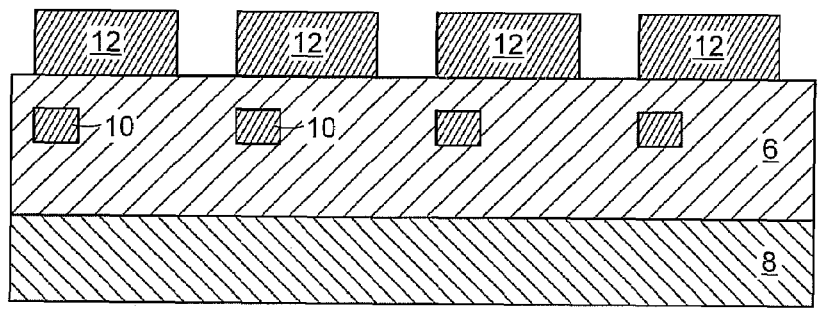
Figure 1C:
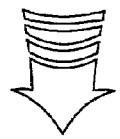
Figure 1C:
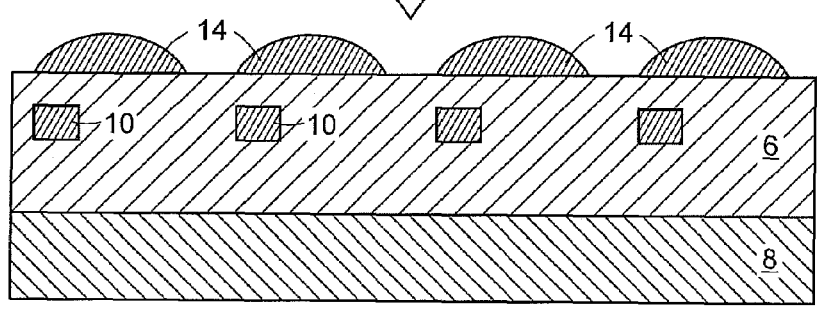

A typical fabrication process will begin with a double layer structure comprising a substrate 8 and a cladding layer 6 formed on the substrate 8, as shown in FIGS. 1A-1C. The cladding layer 6 includes buried waveguides 10. A glass or polymer layer 4 is deposited on the cladding layer 6 which prevents optical power leaking into the substrate 8, as shown in FIG. 1A. The glass/polymer layer 4 is then patterned by microfabrication techniques such as direct laser writing, photolithography, or soft lithography to define mesas 12 with sizes comparable to the final resonating structures, as shown in FIG. 1B. As a final step, a thermal reflow technique is implemented to transform the mesas 12 into microresonator structures 14 with lens-shape, as shown in FIG. 1C. The sidewall roughness is effectively eliminated during the thermal reflow process, leading to atomically smooth resonator surface and ultra-high-Q-factor.

The thermal reflow technique is a process in which glass or polymer materials or devices are annealed above their glass transition temperature in order to induce morphological modifications due to the materials' surface tension. Also, this process has successfully been utilized to remove surface roughness on chalcogenide type structures resulting from patterning processes. A typical reflow process includes annealing of the chalcogenide structures at a temperature ranging from 250° C.-500° C. for a time of a few minutes to a few hours. Thermal reflow technique also provides significant device tolerance to defects in microfabrication processes.

Note throughout the fabrication process the cladding layers contained buried waveguide structures. The typical fabrication process of forming buried channel waveguides for vertical coupling begins with deposition of glass/polymer on $SiO_x$ bottom cladding layer, waveguide pattern definition, top cladding deposition and chemical-mechanical polishing (CMP). A second photo mask can be used for mesa patterning.

In the fabrication process, the selection of a high-index (significantly larger than the cladding layer beneath it), low-glass-transition-temperature (to allow low-temperature processing compatible with current CMOS technology) and low-absorption (transparent to the resonating wavelength) glass/polymer material is critical.

As a possible material candidate, chalcogenide glasses (ChG's), defined as vitreous materials fabricated from metals and/or nonmetals (e.g., As, Ge, Sb) in conjunction with the heavier elements in the oxygen family (i.e., the chalcogens S, Se, Te), possess several properties that make it promising for this application. The high refractive index of chalcogenide glasses prohibits power leaking into substrate and also envisions a compact device integration scheme.

Figure 2:
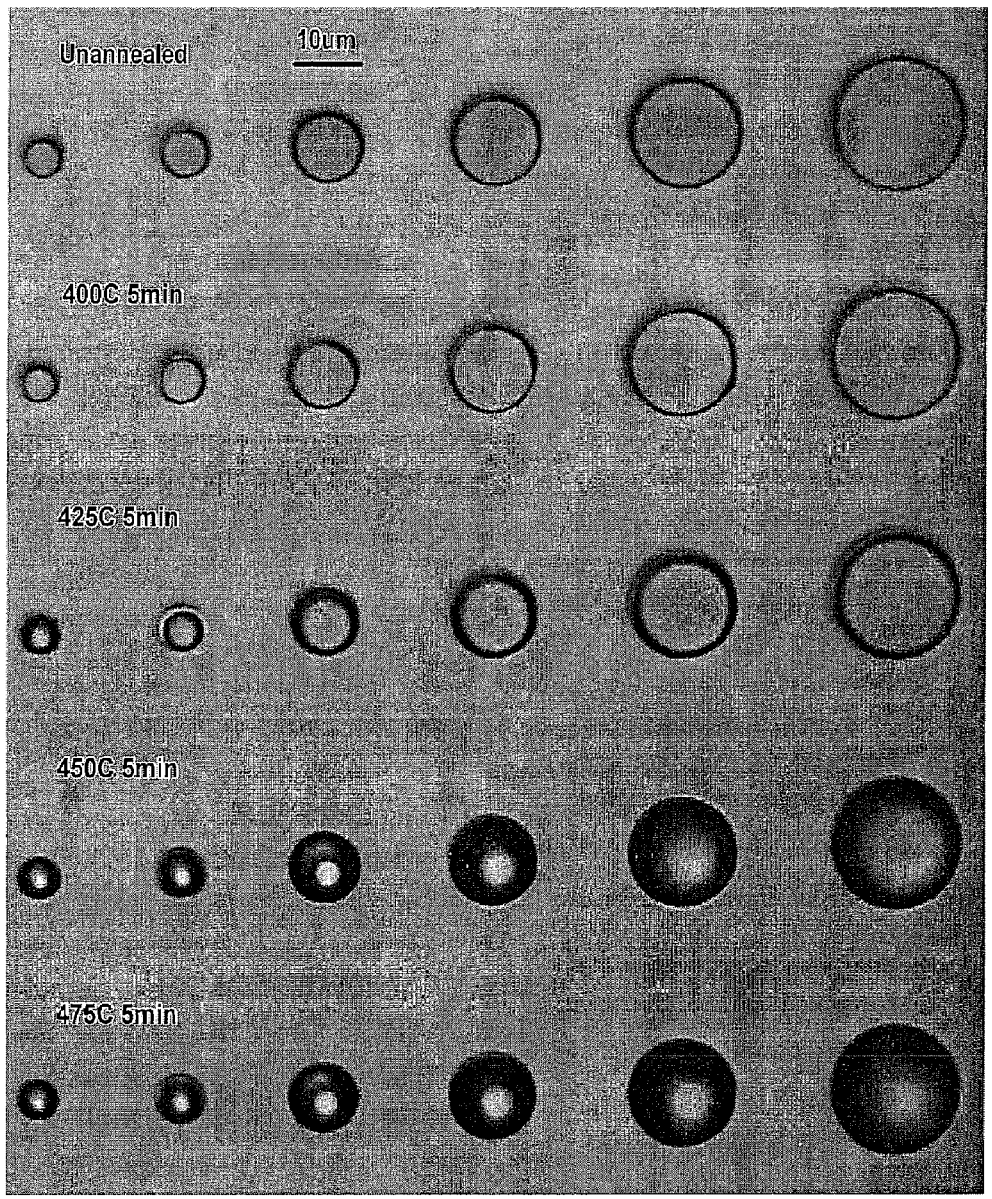
FIG. 2 is a TEM diagram showing the formation of mesas according to the invention.

ChG's also have advantages in that they possess the possibilities of wide refraction index variation depending on their chemical composition, as well as the ability to "tune" other important physical and optical properties. The polymeric structure of amorphous chalcogenides enables a low-temperature (typically<300° C.) thermal reflow technique. Additionally, chalcogenide glasses have the largest known third-order nonlinear optical effects (Kerr effect), which combined with the high-Q cavity design can enable numerous applications in nonlinear optics. In another embodiment, Ge—Sb—S ternary chalcogenide glass is selected as the material for the resonator. The cylindrical mesa structure was defined on $SiO_x$ layer by traditional photolithography, as shown in FIG. 2. The patterned glass mesas were annealed at different temperatures for thermal reflow (400 C, 425 C, 450 c, and 470 C for 5 min.). After annealing at moderate (with respect to the high temperature annealing processes in Si processing) temperature, the mesas transformed to lens-shape as expected. Significant surface smoothing was confirmed by Atomic Force Microscopy, which yielded a very small surface rms roughness of <1 nm.

It is always crucial to control not only the quality factor of a resonator, but also its coupling to the external waveguide bus to achieve different coupling regimes. Vertical coupling features several features attractive for coupling into STIM resonator structures. The coupling strength can be adjusted by tuning the cladding layer thickness as shown in FIGS. 1A-1C, which provides better control on coupling and significantly more tolerance to photolithographic resolution than the traditional lateral coupling. It also accommodates the vertical dimension difference between waveguide bus and STIM resonator.

Rare earth (RE) ions possess numerous transitions in mid-IR range that can be utilized for optical amplification or laser. Chalcogenide glasses have been selected as host material for rare-earth ions due to several desirable material properties: (1) excellent IR transparency that allows IR fluorescence emissions beyond 2 μm, which is prohibited in silica; (2) very low phonon energy which suppresses multiphonon quenching; (3) good rare-earth solubility and (4) electrical conductivity suggesting the possibility of electrical pumping. Non-planar chalcogenide laser has been realized in Nd-doped Ga:La:S glass and optical amplification has also been demonstrated using Nd at 1.08 μm and Pr at 1.31 μm. In addition, chalcogenide glasses have large Raman coefficient, showing promise for Raman amplifiers and lasers. To achieve lasing in mid-IR wavelength range, the use of on-chip chalcogenide ultra-high-Q STIM will serve to decrease cavity loss and reduce lasing threshold.

The STIM resonator, shown in FIGS. 1A-1C, can also be used to form optical sensors, such as sensitive mid-IR sensors for biomolecules, microorganisms and aerosols.

Besides the advantages of forming optical sensors, the invention provides several other desirable characteristics: (1) IR-transparency of chalcogenide glasses enables device operation in mid-IR region, which combined with streamlined design of photonic waveguide structures increase the penetration depth of evanescent optical field; (2) optical resonance in the resonator induces strongly enhanced light-matter interaction, leading to a dramatic improvement of sensor sensitivity; (3) using a thermal reflow technique to reduce sidewall scattering and further increase the device quality factor; (4) compared to fiber sensory systems, the on-chip nature and CMOS-compatibility of the proposed device will improve system robustness and envision monolithic integration with peripheral photonic and electronic circuits.

Although the present invention has been shown and described with respect to several preferred embodiments thereof, various changes, omissions and additions to the form and detail thereof, may be made therein, without departing from the spirit and scope of the invention.

What is claimed is:

1. A resonator structure comprising
   a substrate;
   a cladding layer that is formed on said substrate; and
   a plurality of lens-shaped optical structures that is formed on said cladding layer, said lens-shaped optical structures comprise chacolgenide glass being exposed to a reflow process so as to make smooth the surface of said resonator structure and increase its Q factor.

2. The resonator structure of claim 1, wherein said cladding layer comprises a plurality of buried waveguide structures.

3. The resonator structure of claim 2, wherein said buried waveguide structures are used for vertical coupling with said resonator structure.

4. The resonator structure of claim 1, wherein said substrate comprises Si.

5. The resonator structure of claim 1, wherein said cladding layer comprises $SiO_x$.

6. The resonator structure of claim 1, wherein resonator structure is used in a Raman laser.

7. The resonator structure of claim 1, wherein resonator structure is used in a Raman amplifier.

8. The resonator structure of claim 1, wherein resonator structure is used in an optical sensor.

9. The resonator structure of claim 1, wherein resonator structure is used in a bio-sensor.

10. A method of forming a resonator structure comprising
    providing a substrate;
    forming a cladding layer on said substrate; and
    forming a plurality of lens-shaped optical structures on said cladding layer, said lens-shaped optical structures comprise chalcogenide glass being exposed to a reflow process so as to make smooth the surface of said resonator structure and increase its Q factor.

11. The method of claim 10, wherein said cladding layer comprises a plurality of buried waveguide structures.

12. The method of claim 11, wherein said buried waveguide structures are used for vertical coupling with said resonator structure.

13. The method of claim 10, wherein said substrate comprises Si.

14. The method of claim 10, wherein said cladding layer comprises $SiO_x$.

15. The method of claim 10, wherein resonator structure is used in a Raman laser.

16. The method of claim 10, wherein resonator structure is used in a Raman amplifier.

17. The method of claim 10, wherein resonator structure is used in an optical sensor.

18. The method of claim 10, wherein resonator structure is used in a bio-sensor.

19. The resonator structure of claim 1, wherein said chalcogenide glass comprises vitreous materials fabricated from metals and/or nonmetals in conjunction with the heavier elements in the oxygen family.

20. The method of claim 10, wherein said chalcogenide glass comprises vitreous materials fabricated from metals and/or nonmetals in conjunction with the heavier elements in the oxygen family.

21. The resonator structure of claim 19, wherein said metals and/or nonmetals comprise As, Ge, or Sb.

22. The method of claim 20, wherein said metals and/or nonmetals comprise As, Ge, or Sb.

23. The resonator structure of claim 21, wherein said heavier elements in the oxygen family comprise the chalcogens S, Se, or Te.

24. The method of claim 22, wherein said heavier elements in the oxygen family comprise the chalcogens S, Se, or Te.

* * * * *